United States Patent [19]

Oie et al.

[11] Patent Number: 5,166,033
[45] Date of Patent: Nov. 24, 1992

[54] POSITIVE RESIST COMPOSITION CONTAINING QUINONE DIAZIDE SULFONATE ESTER OF VINYLPHENOL COMPOUNDS OR ISOPROPENYLPHENOL COMPOUNDS

[75] Inventors: Masayuki Oie, Kamakura; Shoji Kawata, Kawasaki; Takamasa Yamada, Komaki, all of Japan

[73] Assignee: Nippon Zeon Co., Ltd., Tokyo, Japan

[21] Appl. No.: 587,917

[22] Filed: Sep. 25, 1990

[30] Foreign Application Priority Data

Oct. 2, 1989 [JP] Japan ................... 1-257271

[51] Int. Cl.$^5$ ............................................. G03F 7/023
[52] U.S. Cl. .................................... 430/192; 430/165; 430/190; 430/193
[58] Field of Search ................ 430/190, 192, 193, 165

[56] References Cited

U.S. PATENT DOCUMENTS

| | | | |
|---|---|---|---|
| 4,139,384 | 2/1979 | Iwasaki et al. | 430/190 |
| 4,358,522 | 11/1982 | Fujita et al. | 430/190 |
| 4,696,886 | 9/1987 | Hanabata et al. | 430/190 |
| 4,828,958 | 5/1989 | Hayase et al. | 430/190 |
| 4,840,869 | 6/1989 | Kita et al. | 430/190 |
| 4,871,644 | 10/1989 | Bauer | 430/190 |

FOREIGN PATENT DOCUMENTS 2507548  2/1975 Fed. Rep. of Germany ...... 430/190

OTHER PUBLICATIONS

Gentaro Nagamatsu and Hideo Inui, "Photosensitive Polymers", Kadamasha, Tokyo (1980) (English Translations).

*Primary Examiner*—Charles L. Bowers, Jr.
*Assistant Examiner*—Christopher G. Young
*Attorney, Agent, or Firm*—Lowe, Price, LeBlanc & Becker

[57] ABSTRACT

Disclosed herein is a positive resist composition comprising an alkali-soluble phenolic resin and the quinonediazide sulfonate of at least one phenolic compound selected from vinylphenol compounds and isopropenylphenol compounds as a photosensitive agent. It is suitable for use in minute processing.

5 Claims, No Drawings

POSITIVE RESIST COMPOSITION CONTAINING QUINONE DIAZIDE SULFONATE ESTER OF VINYLPHENOL COMPOUNDS OR ISOPROPENYLPHENOL COMPOUNDS

FIELD OF THE INVENTION

The present invention relates to a positive resist composition, and more specifically to a positive resist composition suitable for use in minute processing required for the fabrication of semiconductor devices, magnetic bubble memory devices, integrated circuits and the like.

BACKGROUND OF THE INVENTION

Upon the fabrication of a semiconductor, a semiconductor device is formed by a lithography technique in which a resist is applied on the surface of a silicon wafer to form a photosensitive film, the film is exposed to light so as to form a latent image and the latent image is then developed to form a negative or positive image.

A negative resist composed of cyclized polyisoprene and a bisazide compound has heretofore been known as a resist composition for the fabrication of semiconductor devices. However, the negative resist involves a drawback that it cannot be accommodated to the fabrication of semiconductors integrated to high degrees because it is developed with an organic solvent, so that it swells to a significant extent and its resolving power is hence limited. On the other hand, positive resist compositions are believed that they can be satisfactorily accommodated to the integration of semiconductors to a high degree because they are excellent in resolving power compared with the negative resist composition.

Positive resist compositions composed of a novolak resin and a quinonediazide compound have been generally used in this field to date.

However, satisfactory results as to various properties such as sensitivity, resolution, rate of residual film, heat resistance and storage stability are not necessarily obtained from the conventional positive resist compositions. There has been a strong demand for enhancing the performance of the positive resist compositions.

OBJECTS AND SUMMARY OF THE INVENTION

It is an object of this invention is to provide a positive resist composition excellent in various properties such as sensitivity, resolution, rate of residual film, heat resistance, storage stability and resistance to dry etching and suitable for use in minute processing to 1 μm or smaller in line width.

The object of this invention can be achieved by providing a positive resist composition comprising an alkali-soluble phenolic resin and a photosensitive agent, characterized in that the quinonediazide sulfonate of at least one phenolic compound selected from vinylphenol compounds and isopropenylphenol compounds is contained as the photosensitive agent.

DETAILED DESCRIPTION OF THE INVENTION

As exemplary alkali-soluble phenolic resins used in the present invention, may be mentioned condensation products of a phenol and an aldehyde, condensation products of a phenol and a ketone, bisphenol polymers, isopropenylphenol polymers and hydrogenation products of these phenolic resins.

As specific examples of the phenols usable herein, may be mentioned monohydric phenols such as phenol, cresol, xylenol, ethylphenol, propylphenol, butylphenol and phenylphenol, and polyhydric phenols such as resorcinol, pyrocatechol, hydroquione, bisphenol A and pyrogallol.

As specific examples of the aldehydes usable herein, may be mentioned formaldehyde, acetoaldehyde, benzaldehyde and terephthalaldehyde.

As specific examples of the ketones usable herein, may be mentioned acetone, methyl ethyl ketone, diethyl ketone and diphenyl ketone.

The condensation reaction of their corresponding compounds mentioned above can be performed in accordance with a method known per se in the art.

The vinylphenolic polymer is selected from a homopolymer of vinylphenol and copolymers of vinylphenol and a component copolymerizable therewith. As specific examples of the copolymerizable component, may be mentioned acrylic acid derivatives, methacrylic acid derivatives, styrene derivatives, maleic anhydride, meleinimide derivatives, vinyl acetate and acrylonitril.

The isopropenylphenolic polymer is selected from a homopolymer of isopropenylphenol and copolymers of isopropenylphenol and a component copolymerizable therewith. As specific examples of the copolymerizable component, may be mentioned acrylic acid derivatives, methacrylic acid derivatives, styrene derivatives, maleic anhydride, meleinimide derivatives, vinyl acetate and acrylonitril.

The hydrogenation products of these phenolic resins can be prepared by any optional known method. Described specifically, they are obtained by dissolving the phenolic resin in an organic solvent and then introducing hydrogen into the solution in the presence of a homogeneous or heterogeneous hydrogenation catalyst.

These alkali-soluble phenolic resins may be used either singly or in combination.

For example, a copolymer of styrene and acrylic acid, methacrylic acid or maleic anhydride, a copolymer of an alkene and maleic anhydride, a polymer of vinyl alcohol, a polymer of vinylpyrrolidone, rosin shellac and/or the like may be optionally added to the positive resist composition according to this invention in order to improve its developability, storage stability, heat resistance, etc. The amount of these optional components to be added is 0–50 parts by weight, preferably 5–20 parts by weight per 100 parts by weight of the alkali-soluble phenolic resin.

No particular limitation is imposed on the photosensitive agent used in the present invention so long as it is an ester of a vinyl phenol compound and/or isopropenylphenol compound, e.g., vinylphenol, isopropenylphenol, or a ring-substituted product, oligomer (generally, dimer to decamer) or hydrogenated product thereof, with a quinonediazide sulfonic compound. As exemplary quinonediazide sulfonic compounds, may be mentioned 1,2-benzoquinonediazide-4-sulfonic acid, 1,2-naphthoquinone-diazide-4-sulfonic acid, 1,2-naphthoquinonediazide-5-sulfonic acid, 2,1-naphthoquinonediazide-4-sulfonic acid, 2,1-naphthoquinonediazide-5-sulfonic acid and sulfonic acids of other quinonediazide derivatives.

As specific examples of the quinonediazide sulfonate usable in this invention, may be mentioned those whose ester moieties are respectively 1,2-benzoquinonediazide-4-sulfonate, 1,2-naphthoquinonediazide-4-sulfonate, 1,2-naphthoquinone-diazide-5-sulfonate, 2,1-naphthoquinonediazide-4-sulfonate, 2,1-napthoquinonediazide-5-sulfonate and sulfonates of other quninonediazide derivatives. More specifically, esters of the following respective phenolic compounds with the quinonediazide sulfonic compound may be mentioned.

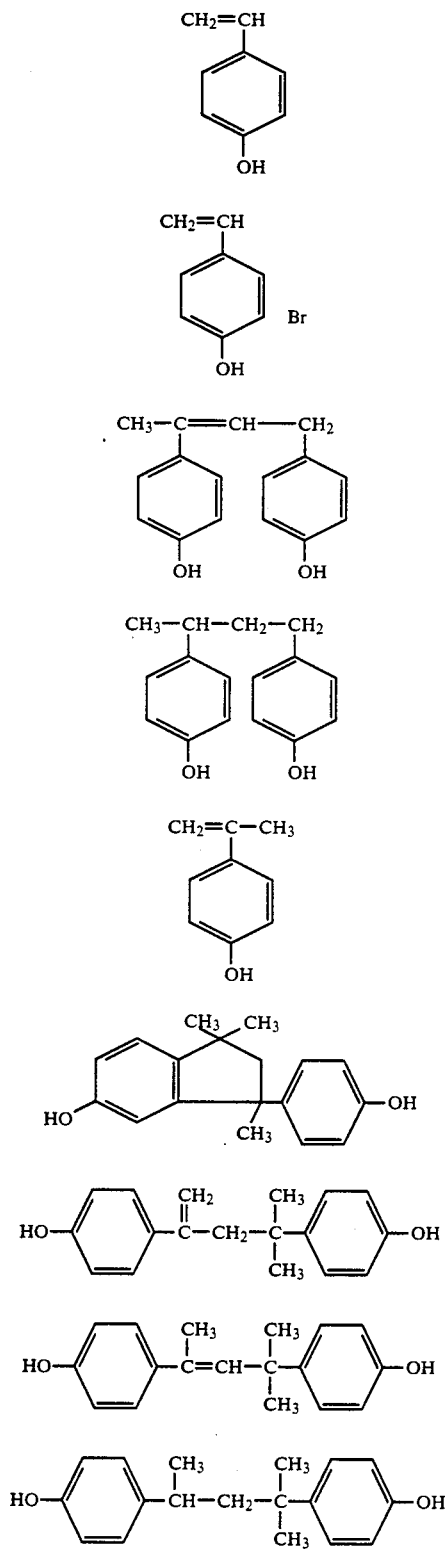

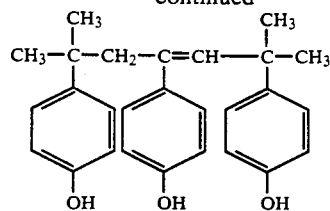

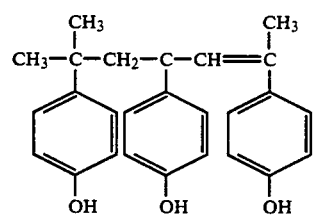

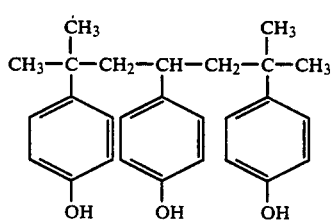

The photosensitive agent in this invention can be synthesized by the esterification reaction of the vinylphenol compound and/or isopropenylphenol compound with the quinonediazide sulfonic compound, namely, for example, by a method in which a quinonediazide sulfonic compound is reacted with chlorosulfonic acid to form a sulfonyl chloride and the thus-formed sulfonyl chloride is then condensed with a phenolic compound in accordance with the conventional method described in Gentaro Matsunaga and Hideo Inui, "Photosensitive Polymers", Kodansha, Tokyo (1980) or the like.

In order for the quinonediazide sulfonate of the phenolic compound to exhibit sufficient performance as a photosensitive agent, it is desirable that the —OH group(s) of the phenolic compound should be converted into the ester group(s) with the quinonediazide sulfonic compound to an extent of, preferably, 50–100%, more preferably, 60–100%, most preferably, 70–100%.

The photosensitive agents according to this invention may be used either singly or in combination. The proportion of the photosensitive agent is 1–100 parts by weight, preferably 3–40 parts by weight per 100 parts by weight of the above-described resin. If the proportion should be lower than 1 part by weight, the formation of any patterns will become substantially impossible. On the other hand, if the proportion should exceed 100 parts by weight, the insolubilization of exposed portions will tend to occur upon developing.

The positive resist composition according to this invention is used in a state that it is dissolved in a solvent. As exemplary solvents, may be mentioned ketones such as acetone, methyl ethyl ketone, cyclohexanone, cyclopentanone and cycloheptanone; alcohols such as n-propyl alcohol, isopropyl alcohol and n-butyl alcohol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate, ethyl butyrate, methyl lactate and ethyl lactate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; halogenated hydrocarbons such as trichloroethylene; aromatic hydrocarbons such as toluene and xylene; and polar solvents such as dimethylacetamide, dimethylformamide and N-methylacetamide. These solvents may be used either singly or in combination.

In the positive resist composition according to this invention, may be contained one or more of compatible additives such as a surfactant, storage stabilizer, sensitizer, anti-striation agent, plasticizer and anti-halation agent, as needed.

An aqueous solution of an alkali is used as a developer for the positive resist composition of this invention. As specific examples of the alkali, may be mentioned inorganic alkalis such as sodium hydroxide, potassium hydroxide, sodium silicate and ammonia; primary amines such as ethylamine and propylamine; secondary amines such as diethylamine and dipropylamine; tertiary amines such as trimethylamine and triethylamine; alcohol amines such as diethylethanolamine and triethanolamine; and quaternary ammonium salts such as tetramethylammonium hydroxide, tetraethylammonium hydroxide, trimethylhydroxymethylammonium hydroxide, triethylhydroxymethylammonium hydroxide and trimethylhydroxyethylammonium hydroxide.

If necessary, suitable amounts of a water-soluble organic solvent such as methanol, ethanol, propanol or ethylene glycol, a surfactant, a storage stabilizer, a dissolution inhibitor for the resin and/or the like may be added further to the aqueous alkali solution.

ADVANTAGES OF THE INVENTION

According to this invention, there can be provided a positive resist composition excellent in sensitivity, resolution, rate of residual film, heat resistance, storage stability, resistance to dry etching, etc., and suitable for use in minute processing to 1 $\mu$m or smaller in line width.

EMBODIMENTS OF THE INVENTION

The present invention will hereinafter be described more specifically by the followinq Examples. Incidentally, all designations of "part" or "parts" and "%" as will be used in the following Examples mean part or parts by weight and wt. % unless otherwise provided.

EXAMPLE 1:

In 320 parts of ethylcellosolve acetate, were dissolved 100 parts of a novolak resin obtained by mixing m-cresol and p-cresol at a molar ratio of 6:4, adding formaline thereto and condensing them by a method known per se in the art using an oxalic acid catalyst and 30 parts of the quinonediazide sulfonate of the phenolic compound represented by the formula (10), in which the —OH groups of the phenolic compound had been converted into the ester groups with 1,2-naphthoquinonediazide-5-sulfonic acid to an extent of 70%. The resulting solution was filtered through a polytetrafluoroethylene filter (PTFE filter) having a pore size of 0.1 $\mu$m to prepare a resist solution.

After applying the resist solution by a coater on a silicon wafer, the resist solution was baked for 90 seconds at 100° C., thereby forming a resist film having a thickness of 1.17 $\mu$m. The thus-formed resist film was exposed using a g-line stepper, "NSR-1505G6E" (manufactured by Nikon Corp., NA =0.54) and a test reticle. The thus-exposed film was then developed by the puddle process for 1 minute at 23° C. in a 2.38% aqueous solution of tetramethylammonium hydroxide, thereby obtaining a positive pattern.

The wafer with the pattern formed thereon was taken out of the aqueous alkali solution to observe it through an electron microscope. As a result, it was found that alternate lines and spaces were resolved at intervals of 0.50 $\mu$m. The film thickness of the pattern was measured by a thickness meter, "Alpha Step 200" (manufactured by Tenko Company) and was found to be 1.15 $\mu$m (rate of residual film: 98.3%).

Using a dry etching apparatus, "DEM-451T" (manufactured by Nichiden Anelva Company), the wafer with the pattern formed thereon was then etched with a 3:1 mixed gas of $CF_4$ and $H_2$ at a power of 300 W, a pressure of 0.03 Torr and a frequency of 13.56 MHz. As a result, it was found that portions of the wafer, on which no pattern had been formed, were only etched.

EXAMPLE 2:

After applying a portion of the resist solution obtained in Example 1 on a silicon wafer by a coater, the resist solution was baked for 90 seconds at 80° C., thereby forming a resist film having a thickness of 1.20 $\mu$m. The thus-formed resist film was exposed using the g-line stepper, "NSR-1505G6E" and a test reticle. The thus-exposed resist film was then subjected to PEB (post-exposure baking) for 60 seconds at 110° C., followed by its development by the puddle process 1 minute at 23° C. in the 2.38% aqueous solution of tetramethylammonium hydroxide to obtain a positive pattern.

The wafer with the pattern formed thereon was taken out of the aqueous alkali solution to observe it through an electron microscope. As a result, it was found that alternate lines and spaces were resolved at intervals of 0.40 $\mu$m. The film thickness of the pattern was measured by the thickness meter, "Alpha Step 200" and was found to be 1.20 $\mu$m (rate of residual film: 100%).

EXAMPLE 3:

In 300 parts of ethyl lactate, were dissolved 100 parts of a novolak resin obtained by mixing m-cresol, p-cresol and 3,5-xylenol at a molar ratio of 50:20:30, adding formaline thereto and condensing them by a method known per se in the art using an oxalic acid catalyst and 18 parts of the quinonediazide sulfonate of the phenolic compound represented by the formula (10), in which the —OH groups of the phenolic compound had been converted into the ester groups with 1,2-naphthoquinonediazide-5-sulfonic acid to an extent of 90%. The resulting solution was filtered through a PTFE filter having a pore size of 0.1 $\mu$m to prepare a resist solution.

After applying the resist solution by a coater on a silicon wafer, the resist solution was baked for 90 seconds at 90° C., thereby forming a resist film having a thickness of 1.17 μm. The thus-formed resist film was exposed using the g-line stepper, "NSR-1505G6E" (NA =0.54) and a test reticle. The thus-exposed resist film was then subjected to PEB for 60 seconds at 110° C., followed by its development by the puddle process for 1 minute at 23° C. in the 2.38% aqueous solution of tetramethylammonium hydroxide to obtain a positive pattern.

The wafer with the pattern formed thereon was taken out of the aqueous alkali solution to observe it through an electron microscope. As a result, it was found that alternate lines and spaces were resolved at intervals of 0.45 μm. The film thickness of the pattern was measured by the thickness meter, "Alpha Step 200" and was found to be 1.16 μm (rate of residual film: 99.1%).

EXAMPLE 4:

In 320 parts of ethylcellosolve acetate, were dissolved 100 parts of a copolymer of vinylphenol and styrene (at a molar ratio of 6:4) and 22 parts of the quinonediazide sulfonate of the phenolic compound represented by the formula (6), in which the —OH groups of the phenolic compound had been converted into the ester groups with 1,2-naphthoquinonediazide-5-sulfonic acid to extent of 90%. The resulting solution was filtered through a PTFE filter having a pore size of 0.1 μm to prepare a resist solution.

After applying the resist solution by a coater on a silicon wafer, the resist solution was baked for 90 seconds at 90° C., thereby forming a resist film having a thickness of 1.17 μm. The thus-formed resist film was exposed using the g-line stepper, "NSR-1505G6E" (NA =0.54) and a test reticle. The thus-exposed resist film was then subjected to PEB for 60 seconds at 110° C., followed by its development by the puddle process for 1 minute at 23° C. in the 2.38% aqueous solution of tetramethylammonium hydroxide to obtain a positive pattern.

The wafer with the pattern formed thereon was taken out of the aqueous alkali solution to observe it through an electron microscope. As a result, it was found that alternate lines and spaces were resolved at intervals of 0.45 μm. The film thickness of the pattern was measured by the thickness meter, "Alpha Step 200" and was found to be 1.10 μm (rate of residual film: 94.0%).

EXAMPLE 5:

In 320 parts of ethylcellosolve acetate, were dissolved 100 parts of a copolymer of isopropenylphenol and styrene (at a molar ratio of 7:3) and 28 parts of the quinonediazide sulfonate of the phenolic compound represented by the formula (9), in which the —OH groups of the phenolic compound had been converted into the ester groups with 1,2-naphthoquinonediazide-5-sulfonic acid to an extent of 80%. The resulting solution was filtered through a PTFE filter having a pore size of 0.1 μm to prepare a resist solution.

After applying the resist solution by a coater on a silicon wafer, the resist solution was baked for 90 seconds at 80° C., thereby forming a resist film having a thickness of 1.17 μm. The thus-formed resist film was exposed using the g-line stepper, "NSR-1505G6E" (NA =0.54) and a test reticle. The thus-exposed resist film was then subjected to PEB for 60 seconds at 110° C., followed by its development by the puddle process for 1 minute at 23° C. in the 2.38% aqueous solution of tetramethylammonium hydroxide to obtain a positive pattern.

The wafer with the pattern formed thereon was taken out of the aqueous alkali solution to observe it through an electron microscope. As a result, it was found that alternate lines and spaces were resolved at intervals of 0.45 μm. The film thickness of the pattern was measured by the thickness meter, "Alpha Step 200" and was found to be 1.10 μm (rate of residual film: 94.0%).

EXAMPLE 6:

In 300 parts of diglyme, were dissolved 100 parts of a novolak resin obtained by mixing m-cresol and p-cresol at a molar ratio of 4:6, adding formaline thereto and condensing them by a method known per se in the art using an oxalic acid catalyst and 20 parts of the quinonediazide sulfonate of the phenolic compound represented by the formula (10), in which the —OH groups of the phenolic compound had been converted into the ester groups with 1,2-naphthoquinonediazide-4-sulfonic acid to an extent of 85%. The resulting solution was filtered through a PTFE filter having a pore size of 0.1 μm to prepare a resist solution.

After applying the resist solution by a coater on a silicon wafer, the resist solution was baked for 90 seconds at 90° C., thereby forming a resist film having a thickness of 1.20 μm. The thus-formed resist film was exposed using an i-line stepper, "ALS WAFERSTEP 2142i" (manufactured by GCA Company, NA =0.54) and a test reticle.

The thus-exposed resist film was then subjected to PEB for 60 seconds at 110° C., followed by its development by the puddle process for 1 minute at 23° C. in the 2.38% aqueous solution of tetramethylammonium hydroxide to obtain a positive pattern.

The wafer with the pattern formed thereon was taken out of the aqueous alkali solution to observe it through an electron microscope. As a result, it was found that alternate lines and spaces were resolved at intervals of 0.45 μm. The film thickness of the pattern was measured by the thickness meter, "Alpha Step 200" and was found to be 1.15 μm (rate of residual film: 95.8%).

EXAMPLE 7:

In 300 parts of diglyme, were dissolved 100 parts of a copolymer of vinylphenol and styrene (at a molar ratio of 6:4) and 25 parts of the quinonediazide sulfonate of the phenolic compound represented by the formula (9), in which the —OH groups of the phenolic compound had been converted into the ester groups with 1,2-naphthoquinonediazide-5-sulfonic acid to an extent of 80%. The resulting solution was filtered through a PTFE filter having a pore size of 0.1 μm to prepare a resist solution.

After applying the resist solution by a coater on a silicon wafer, the resist solution was baked for 90 seconds at 100° C., thereby forming a resist film having a thickness of 1.20 μm. The thus-formed resist film was exposed using the i-line stepper, "ALS WAFERSTEP 2142i" (NA =0.54) and a test reticle. The thus-exposed resist film was then developed by the buddle process for 1 minute at 23° C. in the 2.38% aqueous solution of tetramethylammonium hydroxide to obtain a positive pattern.

The wafer with the pattern formed thereon was taken out of the aqueous alkali solution to observe it through an electron microscope. As a result, it was found that alternate lines and spaces were resolved at intervals of 0.50 μm. The film thickness of the pattern was measured by the thickness meter, "Alpha Step 200" and was found to 1.15 μm (rate of residual film: 95.8%).

EXAMPLE 8:

In 320 parts of ethylcellosolve acetate, were dissolved 100 parts of a novolak resin obtained by mixing m-cresol and p-cresol at a molar ratio of 6:4, adding formaline thereto and condensing them by a method known per se in the art using an oxalic acid catalyst and 23 parts of the quinonediazide sulfonate of the phenolic compound represented by the formula (6), in which the —OH groups of the phenolic compound had been converted into the ester groups with 1,2-naphthoquinonediazide-5-sulfonic acid to an extent of 70%. The resulting solution was filtered through a PTFE filter having a pore size of 0.1 μm to prepare a resist solution.

After applying the resist solution by a coater on a silicon wafer, the resist solution was baked for 90 seconds at 100° C., thereby forming a resist film having a thickness of 1.17 μm. The thus-formed resist film was exposed using the g-line stepper, "NSR-1505G6E" (NA =0.54) and a test reticle. The thus-exposed film was then developed by the puddle process for 1 minute at 23° C. in a 2.38% aqueous solution of tetramethylammonium hydroxide, thereby obtaining a positive pattern.

The wafer with the pattern formed thereon was taken out of the aqueous alkali solution to observe it through an electron microscope. As a result, it was found that alternate lines and spaces were resolved at intervals of 0.50 μm. The film thickness of the pattern was measured by the thickness meter, "Alpha Step 200" and was found to be 1.15 μm (rate of residual film: 98.3%).

EXAMPLE 9:

In 350 parts of ethyl lactate, were dissolved 100 parts of a novolak resin obtained by mixing m-cresol, p-cresol and 3,5-xylenol at a molar ratio of 50:20:30, adding formaline thereto and condensing them by a method known per se in the art using an oxalic acid catalyst and 30 parts of the quinonediazide sulfonate of the phenolic compound represented by the formula (5), in which the —OH group of the phenolic compound had been converted into the ester group with 1,2-naphthoquinonediazide-5-sulfonic acid to an extent of 100%. The resulting solution was filtered through a PTFE filter having a pore size of 0.1 μm to prepare a resist solution.

After applying the resist solution by a coater on a silicon wafer, the resist solution was baked for 90 seconds at 90° C., thereby forming a resist film having a thickness of 1.17 μm. The thus-formed resist film was exposed using the g-line stepper, "NSR-1505G6E" (NA = 0.54) and a test reticle. The thus-exposed resist film was then subjected to PEB for 60 seconds at 110° C., followed by its development by the puddle process for 1 minute at 23° C. in the 2.38% aqueous solution of tetramethylammonium hydroxide to obtain a positive pattern.

The wafer with the pattern formed thereon was taken out of the aqueous alkali solution to observe it through an electron microscope. As a result, it was found that alternate lines and spaces were resolved at intervals of 0.45 μm. The film thickness of the pattern was measured by the thickness meter, "Alpha Step 200" and was found to be 1.16 μm (rate of residual film: 99.1%).

We claim:

1. A positive resist composition comprising in admixture;
   (i) 100 parts by weight of an alkali-soluble phenolic resin;
   (ii) 1–100 parts by weight of a photosensitive ester reaction product of a quinonediazide sulfonic compound and at least one phenolic compound selected from the group consisting of vinylphenol, isopropenylphenol, ring-substituted products of vinylphenol or isopropenylphenol, dimers or trimers of vinylphenol or isopropenylphenol, and hydrogenated products thereof; and
   (iii) sufficient solvent to dissolve the foregoing components.

2. A composition as claimed in claim 1, wherein the quinonediazide sulfonate is an o-quinonediazide sulfonate.

3. A composition as claimed in clam 2, wherein the o-quinonediazide sulfonate is a 1,2-benzoquinone-diazide-4-sulfonate, a 1,2-naphthoquinonediazide-4-sulfonate, a 1,2-naphthoquinonediazide-5-sulfonate, a 2,1-naphthoquinone-diazide-4-sulfonate or a 2,1-naphthoquinonediazide-5-sulfonate.

4. A composition as claimed in claim 1, wherein the degree of esterification, as the quinonediazide sulfonate, of the —OH groups in the phenolic compound, is 50–100%.

5. A composition as claimed in claim 4, wherein the degree of esterification is 70–100%.

* * * * *